United States Patent
Shigematsu

(10) Patent No.: US 9,548,285 B2
(45) Date of Patent: Jan. 17, 2017

(54) METHOD OF MANUFACTURING SEMICONDUCTOR DEVICE

(71) Applicant: Renesas Electronics Corporation, Koutou-ku, Tokyo (JP)

(72) Inventor: Ryoichi Shigematsu, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/973,925

(22) Filed: Dec. 18, 2015

(65) Prior Publication Data

US 2016/0190115 A1 Jun. 30, 2016

(30) Foreign Application Priority Data

Dec. 26, 2014 (JP) .................. 2014-265184

(51) Int. Cl.
*H01L 23/00* (2006.01)
*H01L 23/495* (2006.01)
*H01L 21/48* (2006.01)
*H01L 21/56* (2006.01)

(52) U.S. Cl.
CPC .......... *H01L 24/97* (2013.01); *H01L 21/4842* (2013.01); *H01L 21/565* (2013.01); *H01L 23/49541* (2013.01); *H01L 23/49544* (2013.01); *H01L 2224/05554* (2013.01); *H01L 2224/48095* (2013.01); *H01L 2224/48247* (2013.01); *H01L 2224/48465* (2013.01); *H01L 2224/49171* (2013.01); *H01L 2224/97* (2013.01); *H01L 2924/0002* (2013.01); *H01L 2924/181* (2013.01)

(58) Field of Classification Search
CPC .... H01L 24/97; H01L 21/565; H01L 21/4842; H01L 23/49541; H01L 2224/48095; H01L 2924/181; H01L 2224/48247; H01L 2224/48465; H01L 2224/05554; H01L 2924/0002; H01L 2224/49171; H01L 2224/97; H01L 23/49544
See application file for complete search history.

(56) References Cited

U.S. PATENT DOCUMENTS

2009/0309213 A1* 12/2009 Takahashi ............. H01L 21/561
257/707

FOREIGN PATENT DOCUMENTS

JP H05-315525 A 11/1993
JP 2536184 B2 9/1996

* cited by examiner

*Primary Examiner* — Kyoung Lee
(74) *Attorney, Agent, or Firm* — Shapiro, Gabor and Rosenberger, PLLC

(57) ABSTRACT

Reliability of a semiconductor device is improved. A method of manufacturing the semiconductor device includes a step of cutting a tab suspension lead from a tab suspension lead support portion connected to an outer frame of a lead frame by inserting a jig between two adjacent sealing bodies, the jig having almost the same width as a gap between the adjacent sealing bodies. And, a notch is formed in the tab suspension lead, and the notch is arranged at a position intersecting a side of a sealing body, so that the tab suspension lead is cut at a part of the notch in the step of cutting the tab suspension lead.

15 Claims, 12 Drawing Sheets

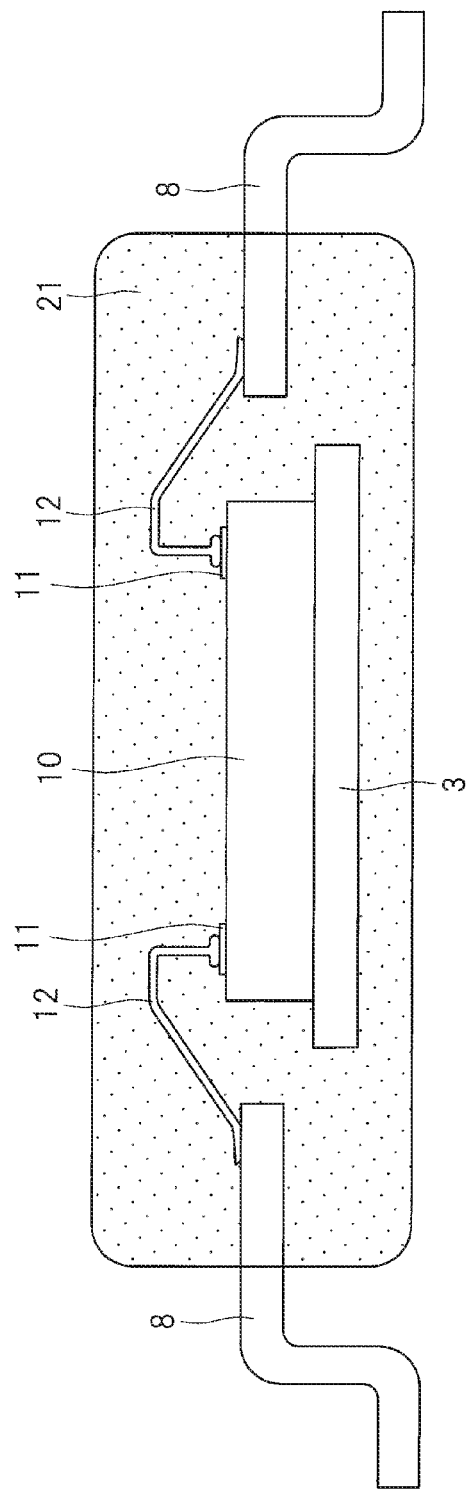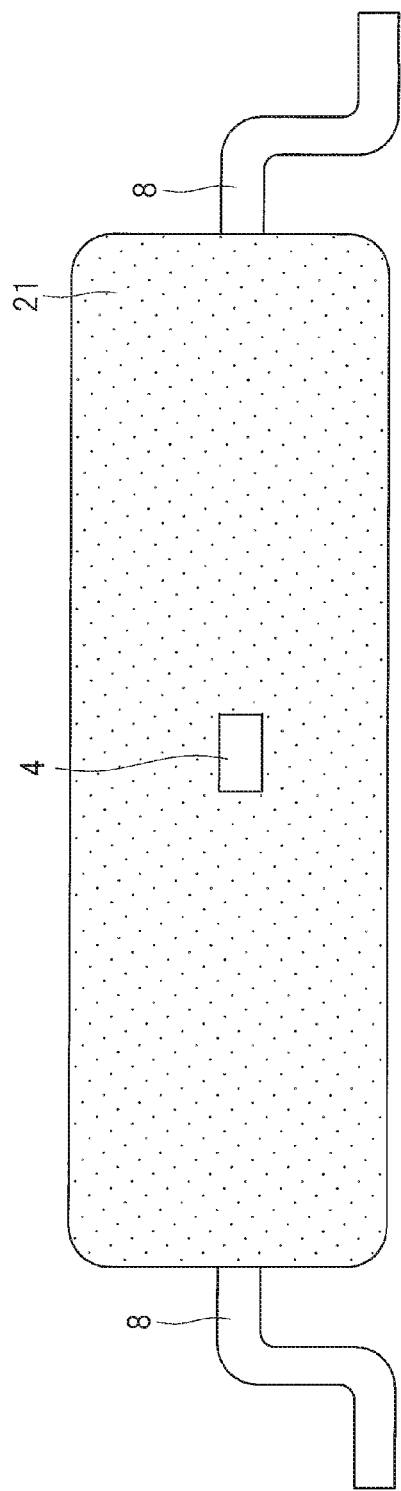

METHOD OF MANUFACTURING SEMICONDUCTOR DEVICE

CROSS-REFERENCE TO RELATED APPLICATION

The present application claims priority from Japanese Patent Application No. 2014-265184 filed on Dec. 26, 2014, the content of which is hereby incorporated by reference into this application.

TECHNICAL FIELD OF THE INVENTION

The present invention relates to a method of manufacturing a semiconductor device, and relates to a technique effectively applied to, for example, a resin-sealing type semiconductor device using a lead frame.

BACKGROUND OF THE INVENTION

Japanese Patent Application Laid-Open Publication No. H05-315525 (Patent Document 1) discloses a structure in which a through hole 6 is provided in a tab suspension lead 5 at an outer side of a mold outer circumferential line 7 in order to prevent peeling of resin or generation of a crack caused by stress at the time of cutting the tab suspension lead 5 while widely maintaining a width of the suspension lead 5 of the mold outer circumferential line 7 in order to facilitate relief of absorbed moisture.

In addition, Japanese Patent No. 2536184 (Patent Document 2) discloses a technique of resolving resin damage in a step of cutting a suspension lead 13 while maintaining a supporting strength by the suspension lead 13 and an extracting auxiliary suspension lead 110.

SUMMARY

The inventor of the present application has studied a semiconductor device mounted on a small package such as a small outline package (SOP), a shrink small outline package (SSOP). Such a small package is manufactured by using a lead frame in which a plurality of individual semiconductor device forming regions are arranged in a matrix form for cost reduction. Further, in order to increase the number of the obtained semiconductor devices in the lead frame, a "through mold system" is used in a resin-sealing step of a semiconductor chip. However, a sealing body that seals the semiconductor chip is closely arranged by using the "through mold system". Therefore, in a step of cutting the tab suspension lead when a plurality of the sealing bodies are cut into individual pieces, a method of cutting the tab suspension lead while putting a die against one surface of the tab suspension lead and putting a punch against the other surface thereof cannot be used. That is, there is no space for inserting both the punch and the die between the adjacent sealing bodies.

Thus, in a semiconductor device studied by the present inventor, a method referred to as "slashing (nadegiri in Japanese)" is executed in a step of cutting the tab suspension lead. That is, the method is a method of supporting a sealing body on one side of the tab suspension lead, and of cutting the tab suspension lead by using a punch (jig) from the other side.

However, in this method, it has been found out that stress caused in the cutting of the tab suspension lead is applied to the sealing body, and thus, a crack is generated in the sealing body at an interface between the tab suspension lead and the sealing body, which results in decrease in the reliability of the semiconductor device. That is, by the study of the present inventor, it has been revealed that there is a problem of malfunctions of the semiconductor device by corrosion of a wiring formed on the semiconductor chip inside the sealing body or others because moisture or others enters therein from the crack part.

Other problems and novel characteristics will be apparent from the description of the present specification and the accompanying drawings.

A method of manufacturing a semiconductor device according to an embodiment includes a step of cutting a tab suspension lead from a tab suspension lead support portion connected to an outer frame of a lead frame by inserting a jig, which has almost the same width as a gap between the adjacent sealing bodies, into the gap between the two adjacent sealing bodies. Further, a notch is formed in the tab suspension lead, the notch is arranged at a position intersecting a side of the sealing body, and the tab suspension lead is cut at the notch in the step of cutting the tab suspension lead.

According to the embodiment described above, reliability of the semiconductor device can be improved.

BRIEF DESCRIPTION OF THE DRAWINGS

FIG. 9A is a cross-sectional view during the process of manufacturing the semiconductor device, continued from FIG. 7;

FIG. 9B is a side view during the process of manufacturing the semiconductor device, continued from FIG. 7;

DETAILED DESCRIPTION (Explanation of Description Format, Basic Term, and Method in Present Application)

In the present application, the embodiments will be described in a plurality of sections or others as a matter of convenience if needed. However, these sections or embodiments are not independently different from each other unless otherwise stated, and are each part of single example, or are modification examples or others each one of which is a detailed part, a part, or entire of the other. Also, in principle, repetitive description of the same part is omitted. Further, each component in the embodiments is not always indispensable unless otherwise stated, when being logically limited to the specific number, or when being not clearly so from the contexts.

Also, when "formed of A" or others is described for materials, components or the like in embodiments, it goes without saying that other components are not eliminated unless otherwise specified to be only the component or when being not clearly so from the contexts. For example, when a component is mentioned, it means "X containing X as a main component" or others. For example, when a "silicon material" or others is mentioned, the silicon material includes not only pure silicon but also SiGe (silicon germanium) alloy or multiple alloy containing silicon as a main component, and a material containing other additives or others. Still further, even when a gold plating, a Cu layer, a nickel-plating, or others is mentioned, they include not only simple components but also components containing gold, Cu, nickel and others as the main components, respectively, unless otherwise stated or when being specifically mentioned.

Further, even when a specific numerical value and quantity are mentioned, the values may be numerical values larger than the specific numerical values or may be numerical values smaller than the specific numerical values unless otherwise stated, when being logically limited to the specific number, or when being not clearly so from the contexts.

Still further, in each drawing of the embodiments, the same or similar parts are denoted by the same or similar symbol or reference number, and the description thereof is not repeated in principle.

In addition, in the accompanying drawings, hatching or others is omitted in some cases even in the cross-sectional surface when the drawings are conversely complicated or when separation from a space is clear. In relation to this point, when being obvious from the description or others, even in a planar closed hole, a background contour line thereof is omitted in some cases. Further, hatching or a dot pattern is attached to even a portion other than a cross-section surface in some cases in order to clearly show that the portion is not a space or to clearly show a boundary between regions.

EMBODIMENT

Method of Manufacturing Semiconductor Device

Figure 1:
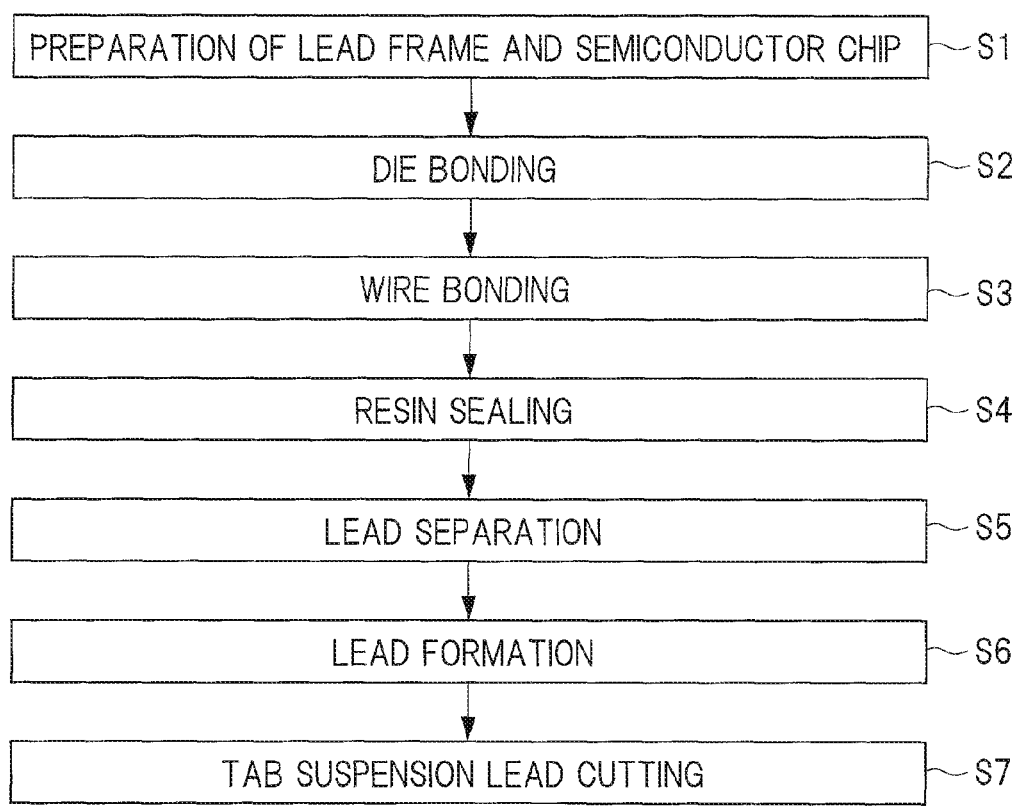
FIG. 1 is a process flow diagram illustrating a process of manufacturing a semiconductor device according to an embodiment.

A method of manufacturing a semiconductor device (semiconductor integrated circuit device) according to the present embodiment will be described with reference to FIGS. 1 to 9. FIG. 1 is a process flow diagram illustrating a process of manufacturing the semiconductor device of the present embodiment. FIGS. 2 to 9 are plan views or cross-sectional views during the process of manufacturing the semiconductor device of the present embodiment. In the plan views, the explanation will be made while a horizontal direction of a sheet is assumed to be an X direction, and a vertical direction thereof is assumed to be a Y direction. The X direction and the Y direction are directions perpendicular to each other.

Figure 2:
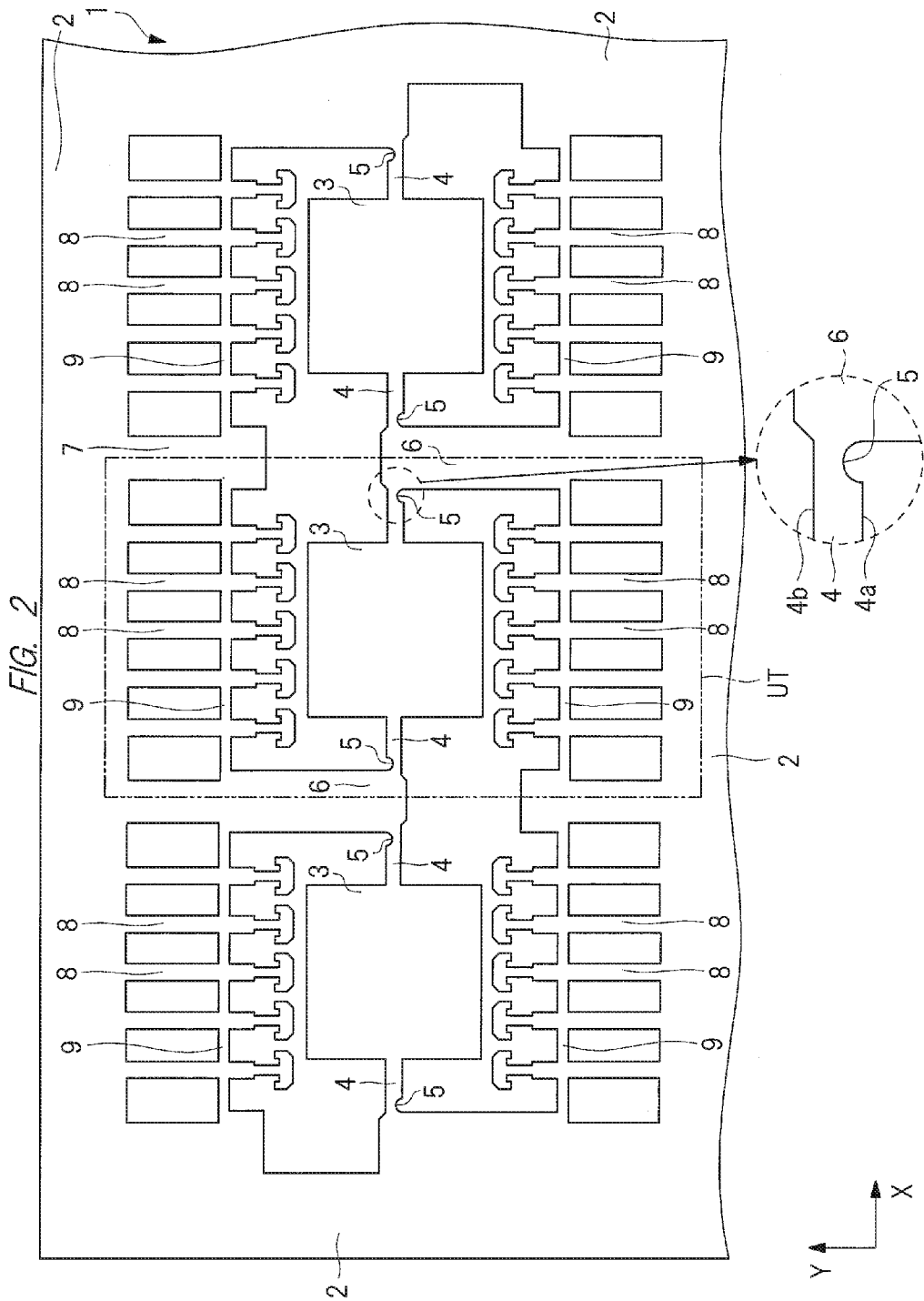
FIG. 2 is a plan view during the process of manufacturing the semiconductor device of the embodiment.

FIG. 2 illustrates a preparation step of a lead frame 1 in a step (S1) of "preparing the lead frame and the semiconductor chip" in the process flow diagram illustrated in FIG. 1. The lead frame 1 has a plurality of unit semiconductor device forming regions UT which are arranged in a matrix form in the X direction and the Y direction. For example, 36 rows of the unit semiconductor device forming regions UT are arranged in the X direction, and 7 columns thereof are arranged in the Y direction, so that 252 unit semiconductor device forming regions UT are arranged in the lead frame 1.

FIG. 2 illustrates three unit semiconductor device forming regions UT configuring one group. That is, 12 groups are arranged in the X direction of the lead frame 1, and the 12 groups arranged in the X direction are arranged in 7 columns. The three unit semiconductor device forming regions UT configuring one group are surrounded by an outer frame 2. A tab suspension lead support portion 6 and a dam bar support portion 7 extend between the adjacent unit semiconductor device forming regions UT in the Y direction from the outer frame 2 extending in the X direction.

A tab 3 having a substantially rectangular shape for mounting a semiconductor chip to be described later is arranged at a center of the unit semiconductor device forming region UT. A tab suspension lead 4 extends in the X direction from each of two sides of the tab 3 extending in the Y direction, and the tab suspension lead 4 is connected to the tab suspension lead support portion 6 extending from the outer frame 2 of the lead frame 1. The tab suspension lead 4 extends with an equal width from the tab 3 toward the tab suspension lead support portions 6, and has a notch 5 at a part itself connected to the tab suspension lead support portion 6. The notch 5 has a substantially semicircular shape, and a width of the part (narrow portion) at which the notch 5 is formed in the tab suspension lead 4 is narrower than a width of a part connected to the tab 3 in the tab suspension lead 4. In addition, a width of the part at which the notch 5 is formed in the tab suspension lead 4 is the narrowest (smallest) in the entire region of the tab suspension lead 4. Further, the notch 5 is formed on only one side 4a of two sides 4a and 4b of the tab suspension lead 4 extending in the X direction, and is not formed on the other side 4b. The two tab suspension leads 4 extend in opposite directions from the tab 3 in the X direction of FIG. 2, and the notches 5 described above are provided in both the tab suspension leads 4. In addition, the tab suspension lead 4 extends to the right and left from the tab suspension lead support portion 6 in the X direction.

In the Y direction, a plurality of leads 8 are arranged on each of both sides of the tab 3, and the plurality of leads 8 extend in the Y direction. One end of each lead 8 is arranged along two sides of the tab 3 extending in the X direction, and the other end is connected to the outer frame 2. In addition, the plurality of leads 8 are connected to the dam bar 9 extending in the X direction, and the dam bar 9 are connected on both ends thereof to the tab suspension lead support portion 6 and the dam bar support portion 7. The plurality of leads 8 are connected to each other via the dam bar 9, and further, are connected to the tab suspension lead support portion 6 and the dam bar support portion 7.

The lead frame is made of, for example, a copper-rich copper-based material or an iron-rich iron-based material.

Figure 3:
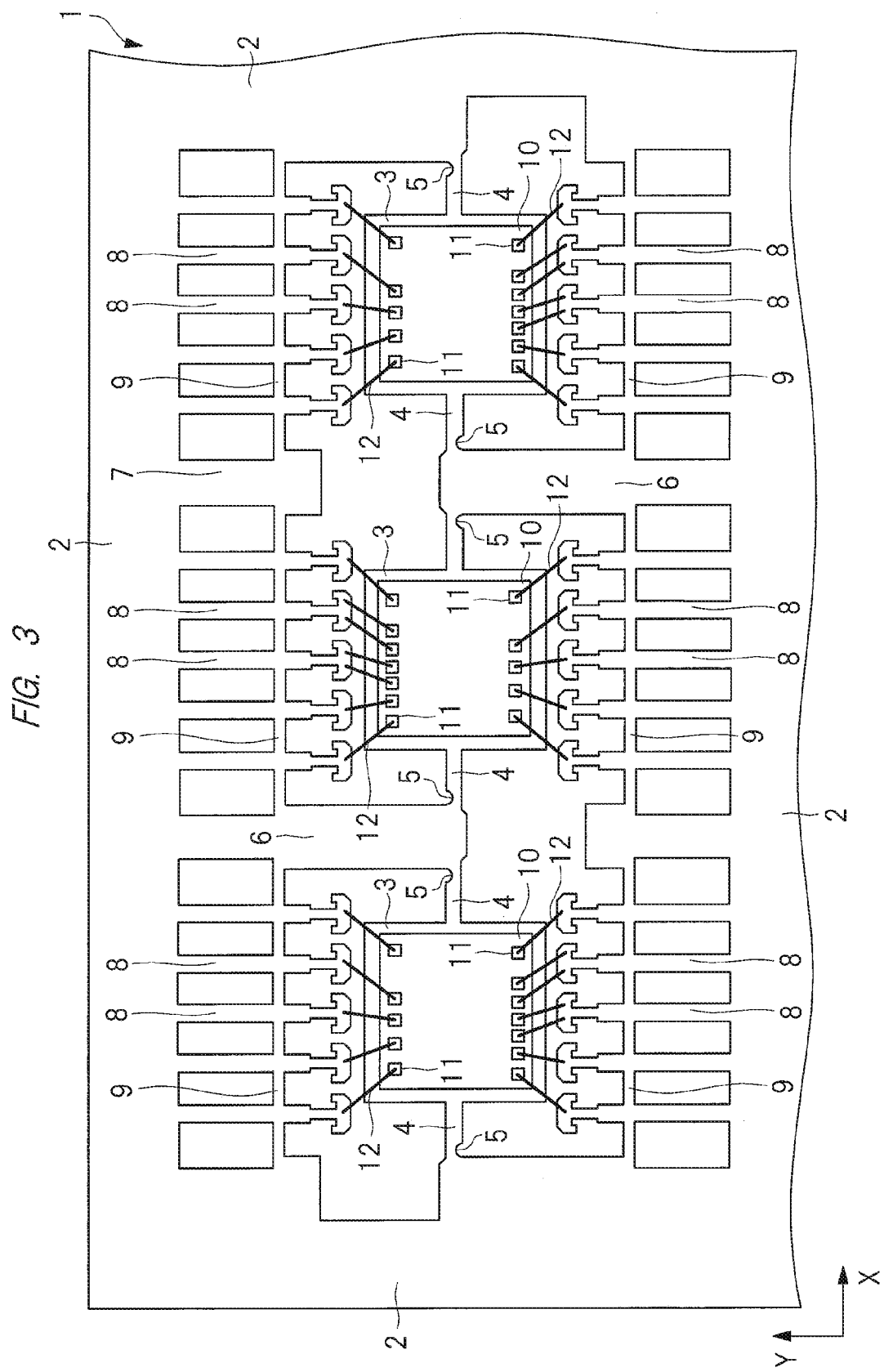
FIG. 3 is a plan view during the process of manufacturing the semiconductor device, continued from FIG. 2.

Next, a semiconductor chip 10 is prepared in the step (S1) of "preparing the lead frame and the semiconductor chip" in the process flow diagram illustrated in FIG. 1. FIG. 3 illustrates a plan view, the semiconductor chip 10 is made of a silicon (Si) substrate having a substantially rectangular shape, and a plurality of semiconductor elements, a plurality of wirings, and a plurality of bonding pads 11 are formed on a main surface of the silicon substrate having the substantially rectangular shape. That is, the plurality of semiconductor elements, the plurality of wirings, and the plurality of bonding pads are formed on the main surface of the semiconductor chip 10. The bonding pad 11 is electrically connected to the semiconductor element via the wiring.

FIG. 3 illustrates a "die bonding" step (S2) and a "wire bonding" step (S3) in the process flow diagram illustrated in FIG. 1.

First, the semiconductor chip 10 is mounted on the tab 3 of the lead frame 1, and the semiconductor chip 10 is bonded to the tab 3 by using an adhesive not illustrated. Next, the bonding pad 11 of the semiconductor chip 10 and one end of the lead 8 are connected to each other via the wire 12. Generally, one bonding pad 11 is connected to one lead 8 via one wire 12. However, two bonding pads 11 may be connected to one lead 8 by using two wires 12. As the wire 11, a copper wire or a gold wire can be used.

Figure 4:
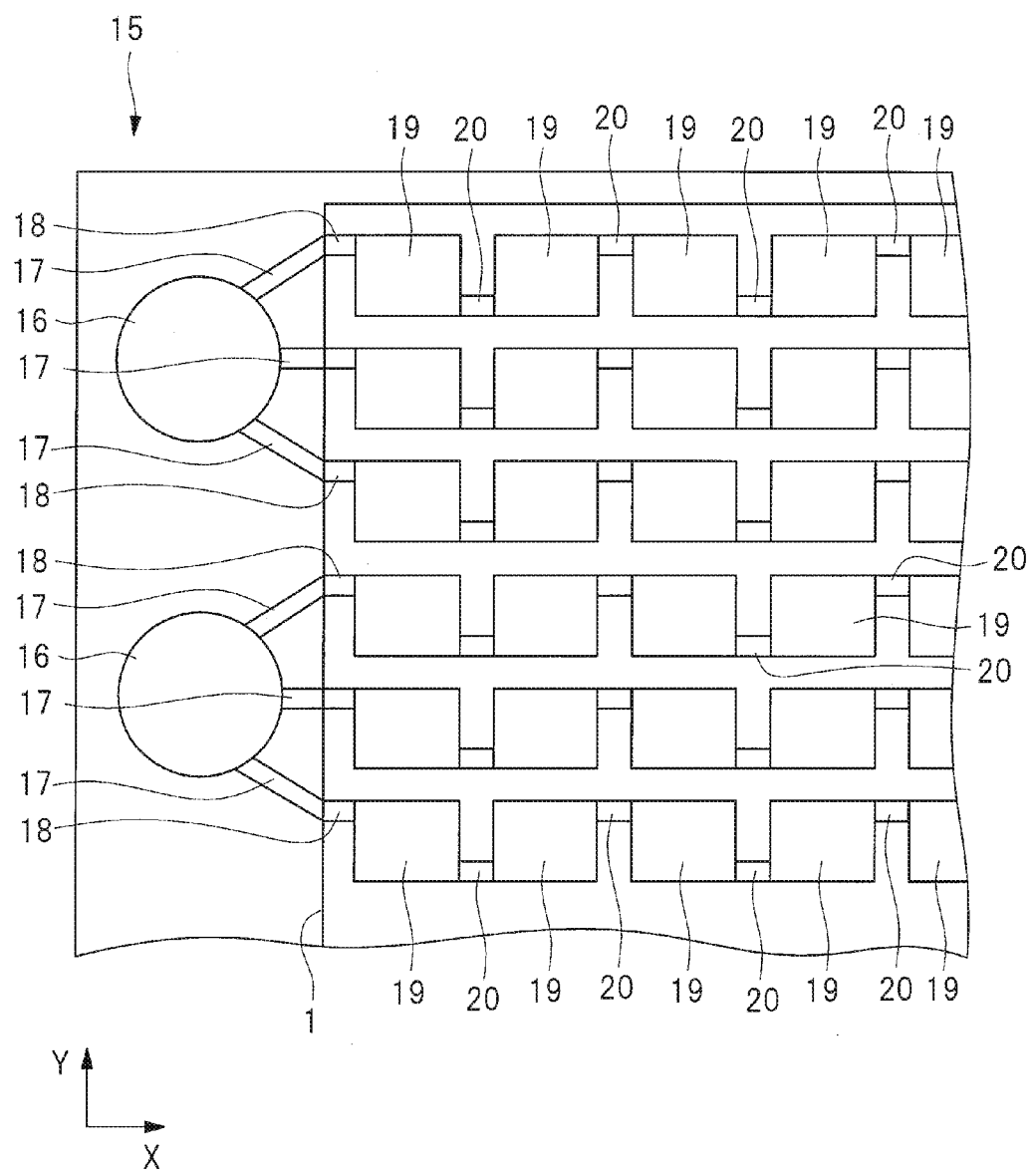
FIG. 4 is a plan view of a resin sealing mold to be used in the process of manufacturing the semiconductor device of the embodiment.
Figure 5:
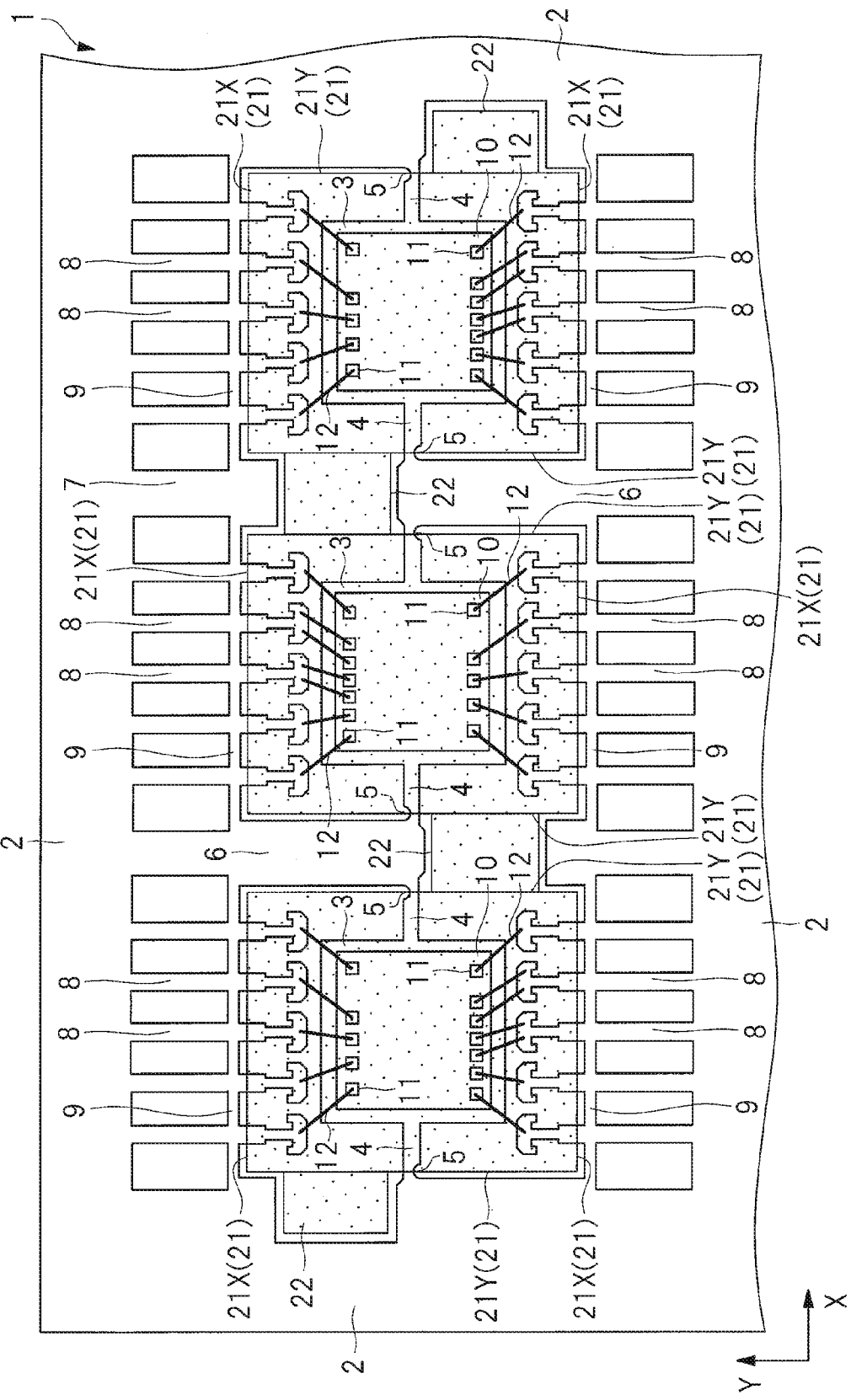
FIG. 5 is a plan view during the process of manufacturing the semiconductor device, continued from FIG. 3.

FIGS. 4 and 5 illustrate a step (S4) of "resin sealing" in the process flow diagram illustrated in FIG. 1. FIG. 4 is a plan view of a resin sealing mold 15. A plunger (resin filling portion) 16, a runner portion 17, a gate portion 18, a cavity portion 19, and a through gate portion 20 are formed in the resin sealing mold 15, and besides, a plurality of the cavity portions 19 and the through gate portions 20 are continuously connected to a tip of the through gate portion 20. That is, the plurality of series-connected cavity portions 19 are connected to the runner portion 17. Further, to one plunger 16, three columns each of which is formed of the plurality of cavity portions connected in series with the runner portion 17 are connected.

A sealing resin (resin) injected in the plunger 16 is injected into a cavity portion 19 via the runner portion 17 and the gate portion 18, and besides, is injected into a next cavity portion 19 via the through gate portion 20. Further, the sealing resin is successively injected into the cavity portion 19 via the through gate portion 20, and the cavity portion is filled with the sealing resin. The sealing resin is made of, for example, an epoxy-based resin. In the X direction, the sealing resin passing through the first cavity portion 19 is injected into the second and subsequent cavity portions 19 communicated with the plunger 16. The sealing resin to be injected into the second cavity portion 19 is injected from the plunger 16 via the first cavity portion 19. Such an injection system of the sealing resin is referred to as "through mold", and has such a feature that the number of the cavity portions 19 that can be arranged in the resin sealing mold 15 can be increased. In other words, the number of the unit semiconductor device forming regions UT that can be arranged in one lead frame 1 can be increased.

The resin sealing mold 15 is configured of an upper mold and a lower mold, the lead frame 1 obtained by completing the step (S3) of "the wire bonding" is sandwiched between the upper mold and the lower mold, and the semiconductor chip 10, the tab 3, the wire 12, and a part of the lead 8 of FIG. 3 are positioned in the cavity portion 19. For example, the plunger is formed in the lower mold, and the cavity portion 19 is formed in both the upper mold and the lower mold. The runner portion 17, the gate portion 18, and the through gate portion 20 are formed in, for example, the lower mold, but may be formed in both the upper mold and the lower mold.

FIG. 5 is a plan view of the lead frame 1 obtained by completing the step (S4) of "the resin sealing". A sealing body 21 covers the semiconductor chip 10, the tab 3, the tab suspension lead 4, the wire 12, and a part of the lead 8. Two sides 21X and 21X of the sealing body 21 extending in the X direction are positioned on the semiconductor chip 10 side to be closer than the dam bar 9. Further, the sealing body 21 covers the tab suspension lead 4, and two sides 21Y and 21Y of the sealing body 21 extending in the Y direction intersect the notch 5 provided in the tab suspension lead 4. FIG. 5 illustrates an outline of the sealing body 21, and this outline illustrates an outer shape of the sealing body 21 on a coupling surface between the upper mold and the lower mold. In other words, the outline is an outer shape of an upper surface or a lower surface of the tab suspension lead 4, which is contacted with the sealing body 21.

In addition, as illustrated in FIG. 5, a gate portion sealing body 22 is formed between the adjacent sealing bodies 21 or on each of both sides of the sealing body 21. The gate portion sealing body 22 is formed at a position corresponding to the gate portion 18 or the through gate portion 20 illustrated in FIG. 4. A resin thickness of the gate portion sealing body 22 is thinner than a resin thickness of the cavity portion 21.

Figure 6:
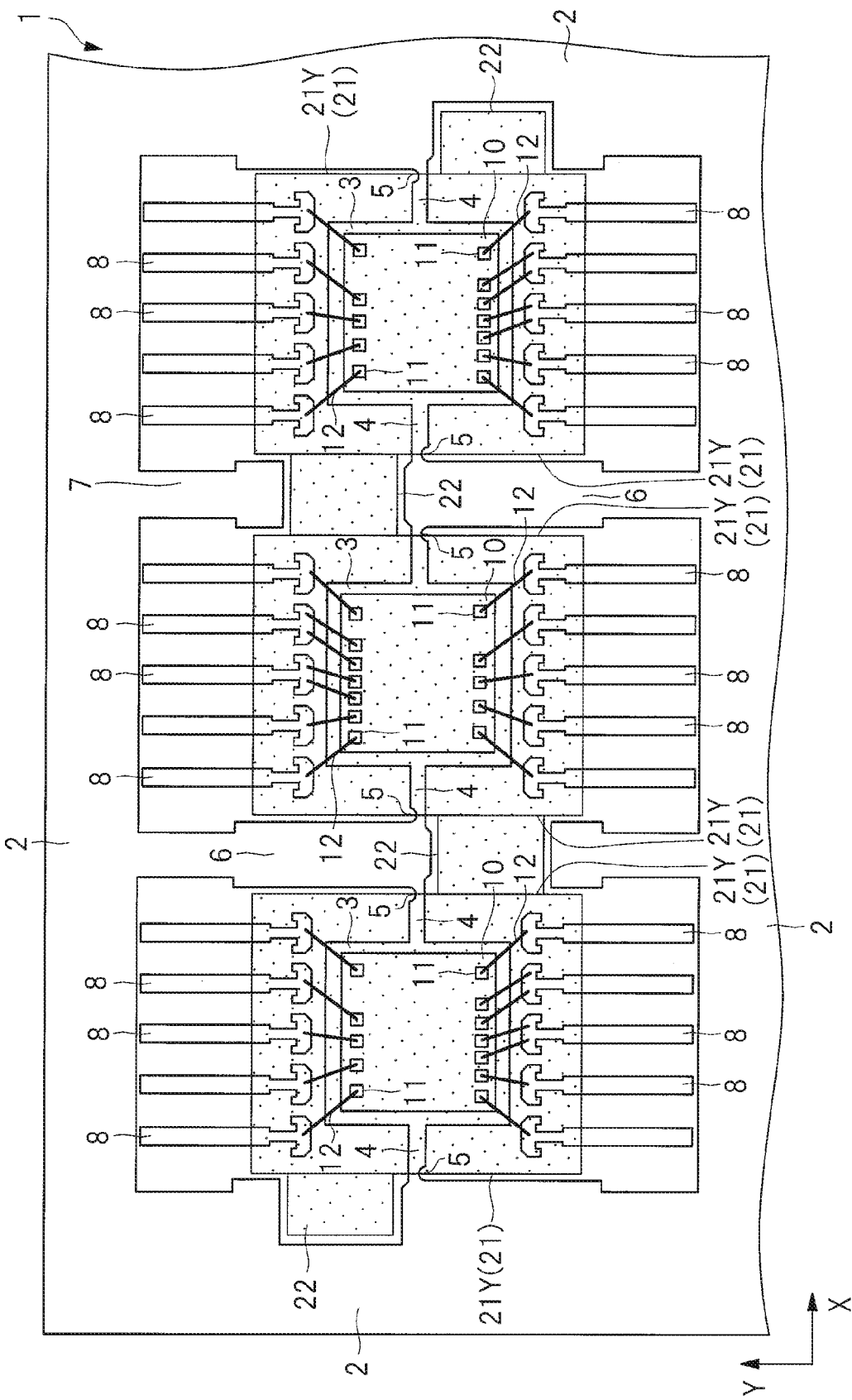
FIG. 6 is a plan view during the process of manufacturing the semiconductor device, continued from FIG. 5.

FIG. 6 illustrates a step (S5) of "the lead separation" in the process flow diagram illustrated in FIG. 1. As illustrated in FIG. 6, the dam bars 9 between the leads 8, between the lead 8 and the tab suspension lead support portion 6, and between the lead 8 and the dam bar support portion 7 are cut. Further, the lead 8 and the outer frame 2 are separated from each other. Through the step (S5) of "the lead separation", the plurality of leads 8 are electrically separated from each other. In cutting the dam bar 9, note that the dam bar can be cut by, for example, causing a die to abut against an upper surface of the lead frame 1, and a punch to abut against a lower surface thereof.

Next, a step (S6) of "the lead formation" in the process flow diagram illustrated in FIG. 1 is performed although not illustrated. As illustrated in FIG. 9, a part exposed from the sealing body 21 of the lead 8 is shaped to be a gull-wing shape (L shape) so that a tip end of the lead 8 is positioned at a lower side than a lower surface of the sealing body 21.

Figure 7:
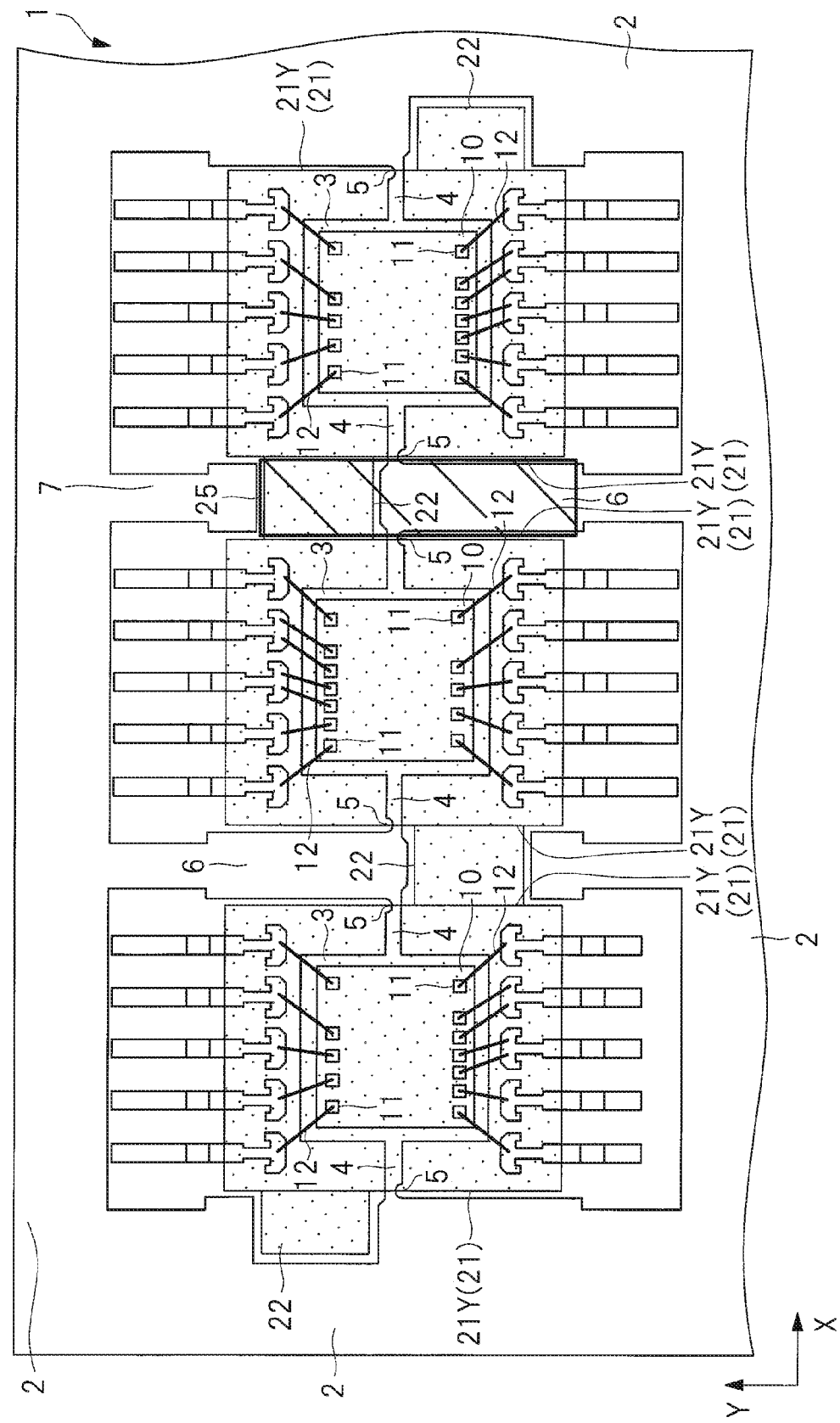
FIG. 7 is a plan view during the process of manufacturing the semiconductor device, continued from FIG. 6.

FIG. 7 illustrates a step (S7) of "the tab suspension lead cutting" in the process flow diagram illustrated in FIG. 1. A jig (punch) 25 is inserted between the adjacent sealing bodies 21 to press the tab suspension lead support portion 6 of the lead frame 1, so that the tab suspension lead 4 is separated (cut) from the tab suspension lead support portion 6.

Figure 8:
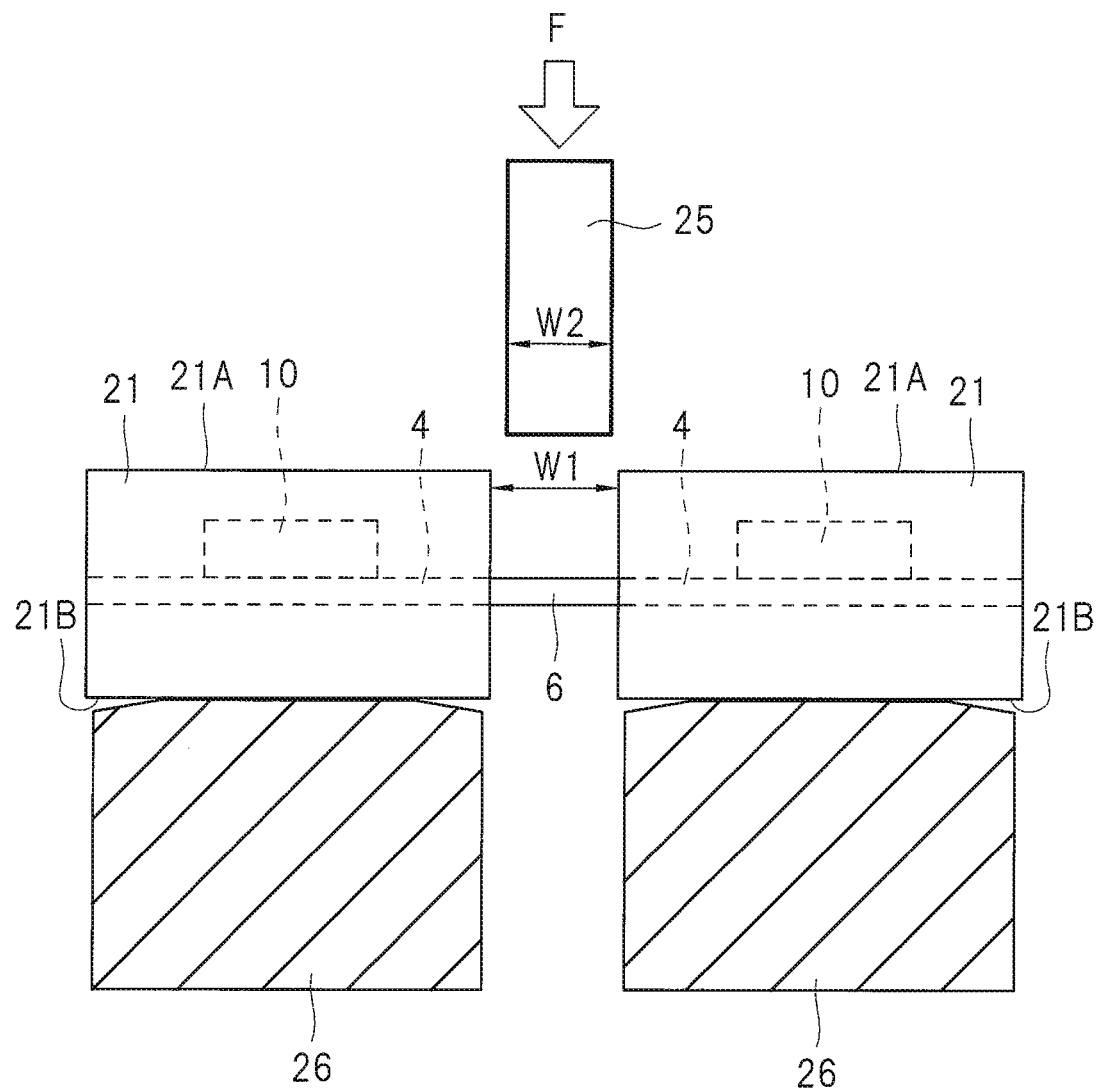
FIG. 8 is a cross-sectional view during the process of manufacturing the semiconductor device, continued from FIG. 6.

FIG. 8 illustrates a cross-sectional view in the cutting of the tab suspension lead 4 by using the jig 25. The sealing body 21 has a main surface 21A and a rear surface 21B. For example, the main surface 21A corresponds to the main surface side of the semiconductor chip 10. The rear surface 21B side of the sealing body 21 is arranged on a die (support base) 26 serving as a supporting body, and the tab suspension lead support portion 6 is pressed by using the jig 25 from the main surface 21A side of the sealing body 21 with a pressing force F, so that the tab suspension lead 4 is cut (separated) from the tab suspension lead support portion 6. As illustrated in FIG. 8, a method of cutting the tab suspension lead 4 from the tab suspension lead support portion 6 is referred to as "slashing (nadegiri in Japanese)", the method being performed in a state in which the rear surface 21B of the sealing body 21 is supported but the rear surface side 21B does not support the tab suspension lead support portion 6 when the jig 25 for cutting is inserted from the main surface side 21A of the sealing body 21.

Here, the jig 25 is required to be inserted into a gap W1 between the adjacent sealing bodies 21, and therefore, the gap is required to be larger than a width W2 of the jig 25 (W1>W2). In addition, the gap W1 of the sealing body 21 is set in consideration of a clearance between the jig 25 and the sealing body 21 so that the sealing body 21 is not damaged by the jig 25. However, the gap W1 between the adjacent sealing bodies 21 is set to be narrow as small as a jig similar to the jig 25 does not abut against the rear surface side 21B of the sealing body 21. That is, the gap W1 between the adjacent sealing bodies 21 is narrower (smaller) than twice the width W2 of the jig 25 (W1<2×W2).

As illustrated in FIG. 7, note that the gate portion sealing body 22 is also cut from the sealing body 21 by using the jig 25 in cutting the tab suspension lead 4 from the tab suspension lead support portion 6. That is, the gate portion sealing body 22 is also removed from the sealing body 21 in the step (S7) of "the tab suspension lead cutting" in the process flow diagram illustrated in FIG. 1. However, both the cutting may be performed in different steps from each other. Through the step (S7) of "the tab suspension lead cutting", the semiconductor device can be cut into individual pieces.

As described in FIGS. 7 and 8, the notch 5 is provided in the tab suspension lead 4, and therefore, this part serves as a cut end, and the tab suspension lead 4 can be cut from the tab suspension lead support portion 6 at the part (narrow portion) corresponding to the notch 5. That is, the tab suspension lead 4 can be separated (cut) from the tab suspension lead support portion 6 with a small stress. In addition, since the side 21Y of the sealing body 21 intersects the notch 5, the tab suspension lead 4 is cut along the side 21Y. Therefore, when seen in a plan view, the tab suspension lead 4 can have such a structure as not protruding from the side 21Y. In other words, a protruding amount of the tab suspension lead 4 can be reduced. In this manner, the tab suspension lead 4 can cut with a small pressing force, and therefore, the sealing body 21 can be prevented from occurrence of a crack, and entering of moisture into the sealing body 21 can be prevented (suppressed), so that the semiconductor device with high reliability can be provided.

FIG. 9A is a cross-sectional view in the Y direction of the semiconductor device which has been cut into an individual piece, and FIG. 9B is a side view of the semiconductor device in the X direction.

As illustrated in FIG. 9A, the semiconductor device has the semiconductor chip 10, the tab 3, the plurality of leads 8, the plurality of wires 12, and the sealing body 21. The semiconductor chip 10 is bonded onto the tab 3 by using an adhesive (not illustrated), and the plurality of bonding pads 11 formed on the main surface of the semiconductor chip 10 are electrically connected to the leads 8 via the wire 12. The tab 3, the semiconductor chip 10, the plurality of wires 12, and the plurality of leads 8 are sealed by the sealing body 21.

The tab suspension lead 4 as illustrated in FIG. 9B is exposed from a side surface of the sealing body 21. In the exposed portion, the tab suspension lead 4 has a substantially rectangular shape. This means that a planer shape of the tab suspension lead 4 is processed by not etching but pressing. That is, the tab suspension lead 4 has two flat side surfaces in a thickness direction.

Modification Example 1

Figure 10:
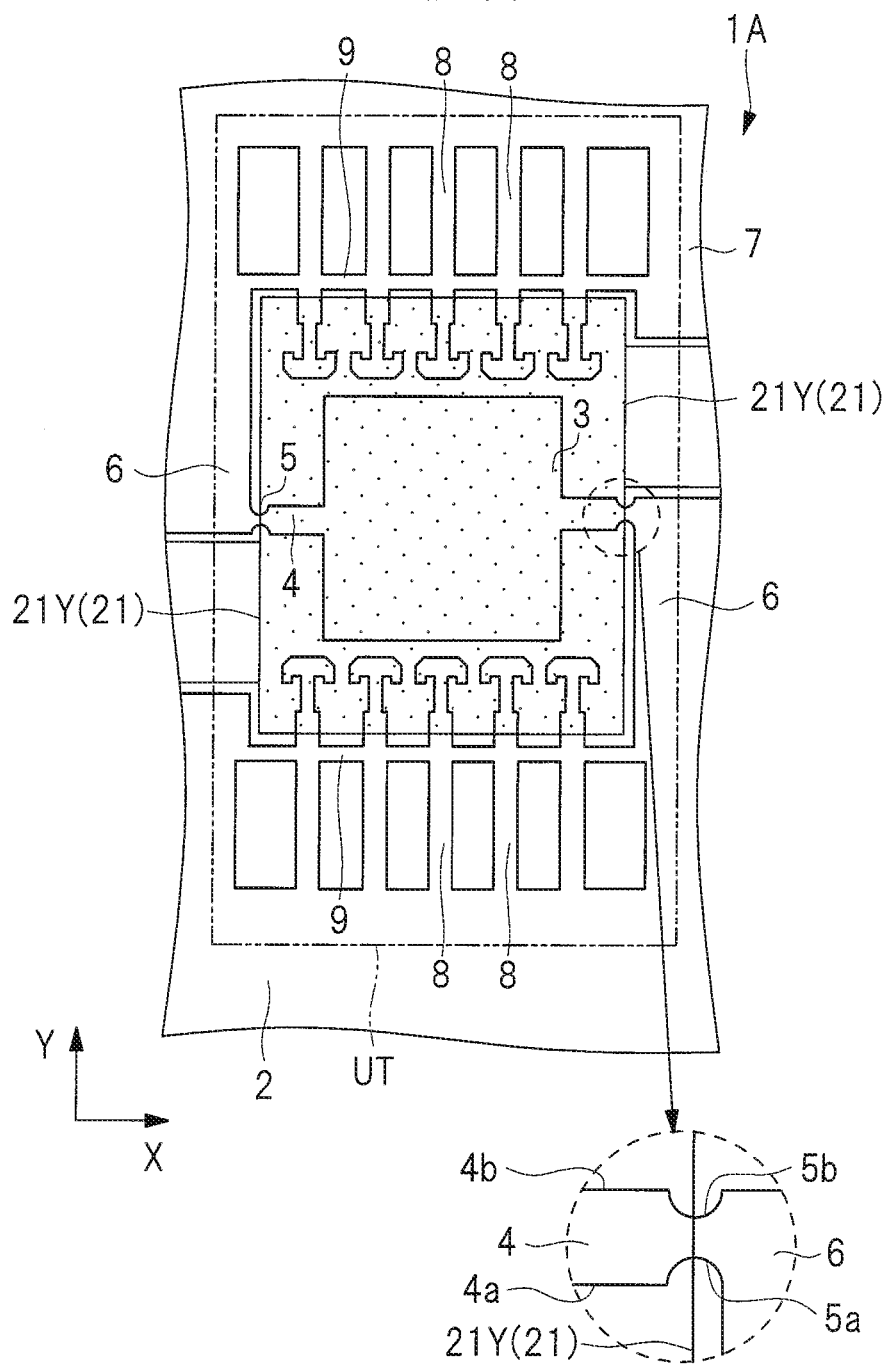
FIG. 10 is a plan view during a process of manufacturing a semiconductor device of a modification example 1.

FIG. 10 is a plan view illustrating a modification example of the lead frame illustrated in FIG. 2. While the modification example is different from the lead frame 1 of the above-described embodiment in a structure of the notch 5, the modification example is the same as that in other parts, and therefore, the parts are denoted by the same reference symbols of the above-described embodiment, and the description thereof will be omitted. In FIG. 10, the reference symbol of a lead frame of the modification example 1 is represented by a reference symbol "1A". In addition, only a part corresponding to the unit semiconductor device forming region UT of the lead frame 1A is illustrated.

As illustrated in FIG. 10, the tab suspension lead 4 extending from the tab 3 in the X direction has the two sides 4a and 4b, and two notches 5a and 5b are provided in a part at which the tab suspension lead 4 is connected to the tab suspension lead support portion 6. The two notches 5a and 5b have substantially semicircular shapes, and the notch 5a is provided at the side 4a, and the notch 5b is provided at the side 4b. The two notches 5a and 5b are arranged at corresponding positions in the Y direction, and a width of the tab suspension lead 4 of the part (narrow portion) is narrower (smaller) than a width of a part of the tab suspension lead 4 to be connected to the tab 3. Of course, in the X direction, the notches 5a and 5b described above are formed in the two tab suspension leads 4 extending form the tab 3.

In addition, FIG. 10 illustrates the outer shape of the sealing body 21, and the two sides 21Y and 21Y of the sealing body 21 extending in the Y direction intersect the notches 5a and 5b as similar to the above-described embodiment. In other words, the two sides 21Y and 21Y of the sealing body 21 intersect the narrow portions of the tab suspension leads 4.

Since the notches 5a and 5b are provided at both the sides 4a and 4b of the tab suspension lead 4, respectively, the tab suspension lead 4 can be cut with a smaller stress than that of the above-described embodiment, and the sealing body 21 can be prevented from the occurrence of the crack.

Modification Example 2

Figure 11A:
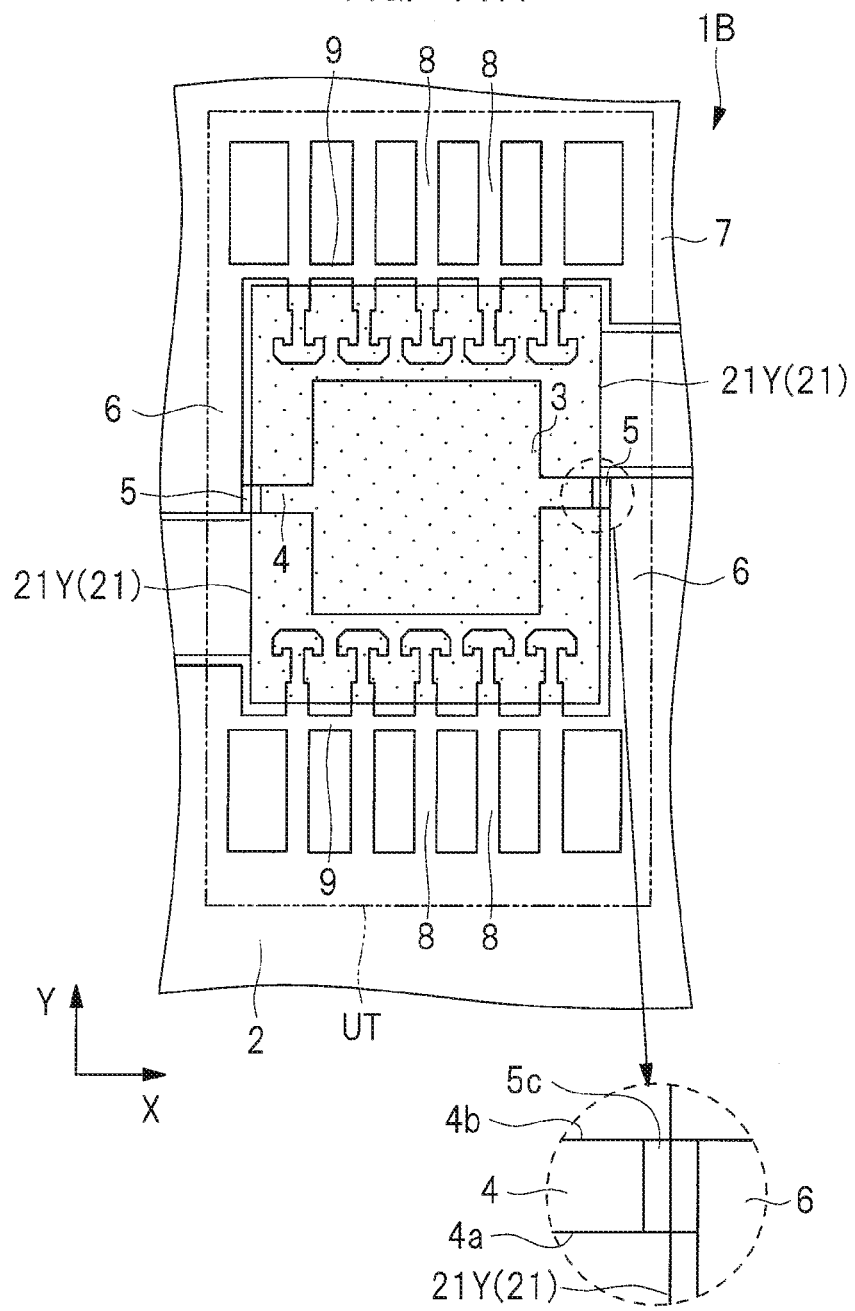
FIG. 11A is a plan view during a process of manufacturing a semiconductor device of a modification example 2.
Figure 11B:
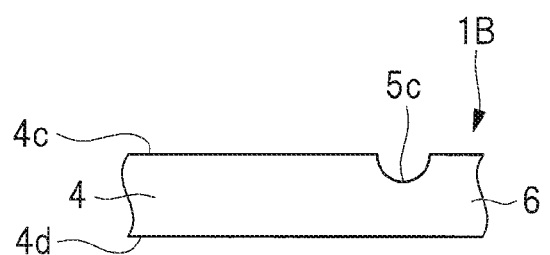
FIG. 11B is a cross-sectional view during the process of manufacturing the semiconductor device of the modification example 2.

FIGS. 11A and 11B are a plan view and a cross-sectional view illustrating a modification example of the lead frame illustrated in FIG. 2. While the modification example is different from the lead frame 1 of the above-described embodiment in a structure of the notch 5, the modification example is the same as that in other parts, and therefore, the parts are denoted by the same reference symbols of the above-described embodiment, and the description thereof will be omitted. In FIGS. 11A and 11B, a reference symbol of a lead frame of the modification example 1 is represented by "1B". In addition, only a part corresponding to the unit semiconductor device forming region UT of the lead frame 1B is illustrated.

As illustrated in FIGS. 11A and 11B, the tab suspension lead 4 extending from the tab 3 in the X direction has the two sides 4a and 4b, and a groove 5c having a substantially semicircular cross-sectional surface is provided from the side 4a to the side 4b in the part at which the tab suspension lead 4 is connected to the tab suspension lead support portion 6. In addition, the tab suspension lead 4 has a main surface 4c and a rear surface 4d, and the groove 5c is formed on the main surface 4c. A thickness of the tab suspension lead 4 at a formation portion of the groove 5c is thinner (smaller) than a thickness of the part of the tab suspension lead 4 to be connected to the tab 3. The part to be connected to the tab 3 in the tab suspension lead 4 can be referred to as a "thick portion", and the formation portion of the groove 5c can be referred to as a "thin portion". Of course, in the X direction, the grooves 5c are formed in the two tab suspension leads 4 extending from the tab 3. Note that a cross-sectional structure of the groove 5c may have a V shape, a U shape, or others.

In addition, FIG. 11A illustrates the outer shape of the sealing body 21, and the two sides 21Y and 21Y of the sealing body 21 extending in the Y direction intersect the grooves 5c as similar to the above-described embodiment. In other words, the two sides 21Y and 21Y of the sealing body 21 intersect the thin portions of the tab suspension leads 4.

Since the groove 5c is formed in the tab suspension lead 4 at a boundary portion between the tab suspension lead 4 and the tab suspension lead support portion 6, the tab suspension lead 4 can be cut with the small stress, so that the sealing body 21 can be prevented from the occurrence of the crack.

Modification Example 3

Figure 12A:
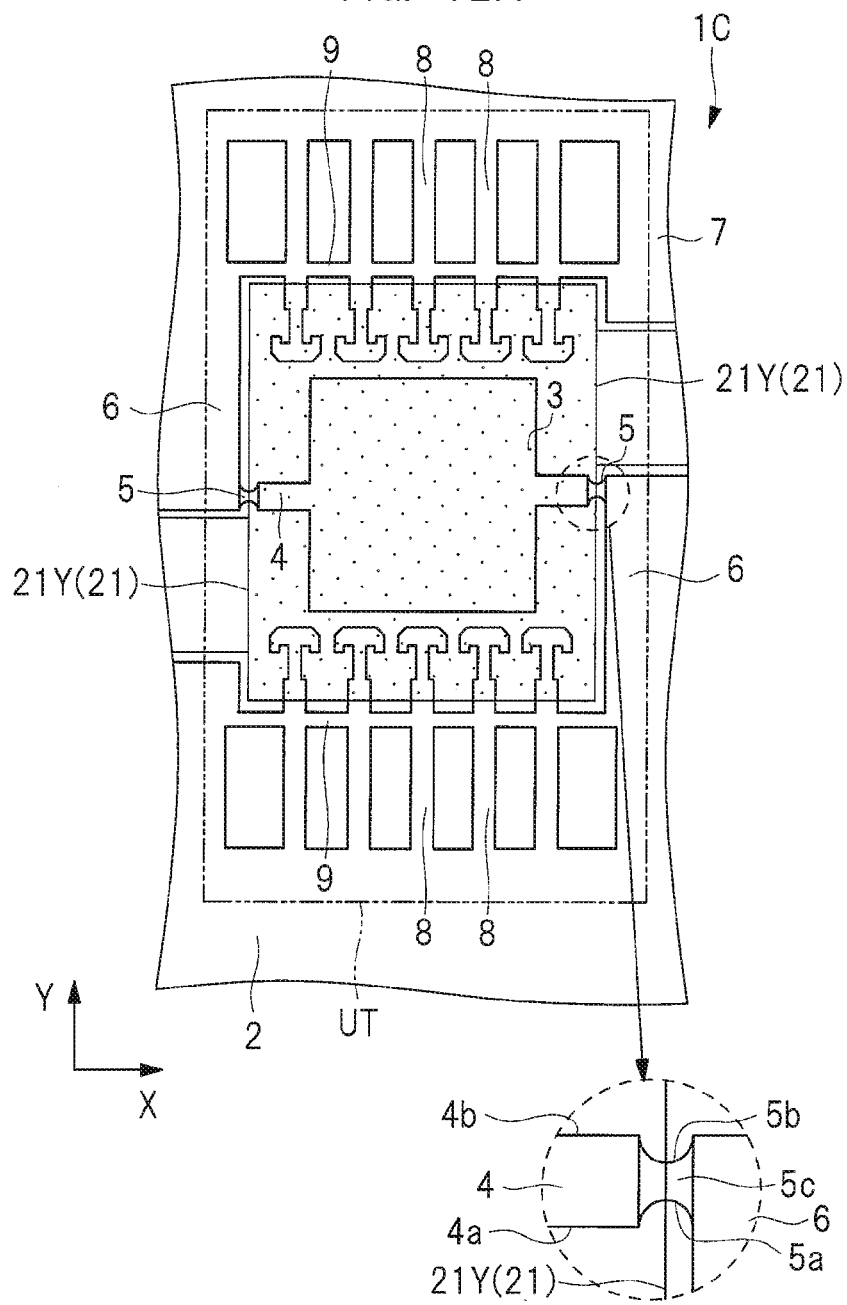
FIG. 12A is a plan view during a process of manufacturing a semiconductor device of a modification example 3.
Figure 12B:
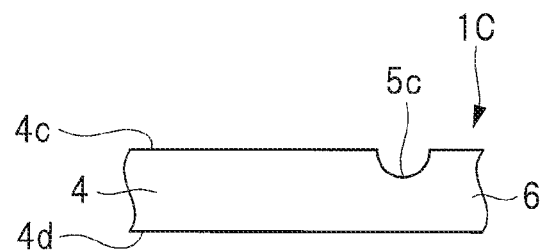
FIG. 12B is a cross-sectional view during the process of manufacturing the semiconductor device of the modification example 3.

FIGS. 12A and 12B are a plan view and a cross-sectional view illustrating a modification example of the lead frame illustrated in FIG. 2. While the modification example is different from the lead frame 1 of the above-described embodiment in a structure of the notch 5, the modification example is the same as that in other parts, and the parts are denoted by the same reference symbols of the above-described embodiment, and the description thereof will be omitted. In FIG. 10, a reference symbol of a lead frame of the modification example 1 is represented by "1C". In addition, only apart corresponding to the unit semiconductor device forming region UT of the lead frame 1B is illustrated. The lead frame 1C of the modification example 3 has a structure obtained by combining the modification example 1 and modification example 2.

As illustrated in FIGS. 12A and 12B, the tab suspension lead 4 extending from the tab 3 in the X direction has the two sides 4a and 4b, and the two notches 5a and 5b are provided in a part at which the tab suspension lead 4 is connected to the tab suspension lead support portion 6. The two notches 5a and 5b have substantially semicircular shapes, and the notch 5a is provided at the side 4a, and the notch 5b is provided at the side 4b. The two notches 5a and 5b are arranged at corresponding positions in the Y direction, and a width of the tab suspension lead 4 of the part (narrow portion) is narrower (smaller) than a width of the part of the tab suspension lead 4 to be connected to the tab 3. Further, in the part at which the tab suspension lead 4 is connected to the tab suspension lead support portion 6, the groove 5c having the substantially semicircular cross-section surface is provided from the side 4a to the side 4b. In addition, the tab suspension lead 4 has the main surface 4c and the rear surface 4d, and the groove 5c is formed on the main surface 4c. A thickness of the tab suspension lead 4 at a formation portion of the groove 5c is thinner (smaller) than a thickness of the part of the tab suspension lead 4 to be connected to the tab 3. The part to be connected to the tab 3 in the tab suspension lead 4 can be referred to as the "thick portion", and the formation portion of the groove 5c therein can be referred to as the "thin portion". Of course, in the X direction, the grooves 5c are formed in the two tab suspension leads 4 extending from the tab 3. Note that the cross-sectional structure of the groove 5c may have a V shape, a U shape, or others. In addition, the groove 5c and the notches 5a and 5b are arranged at corresponding positions.

In addition, FIG. 12A illustrates the outer shape of the sealing body 21, and the two sides 21Y and 21Y of the sealing body 21 extending in the Y direction intersect the notch 5a and 5b, and besides, the grooves 5c, as similar to the above-described embodiment. In other words, the two sides 21Y and 21Y of the sealing body 21 intersect the narrow portion and the thin portion of the tab suspension leads 4. Only either one of the notch 5a or 5b may be formed.

The notches 5a and 5b are provided at both the sides 4a and 4b of the tab suspension lead 4, respectively, and besides, the groove 5c is also formed in the parts thereof where the notches 5a and 5b are formed, and therefore, the tab suspension lead 4 can be cut with the smaller stress than that of the above-described embodiment, so that the sealing body 21 can be prevented from the occurrence of the crack.

In the foregoing, the invention made by the inventor of the present application has been concretely described based on the embodiments. However, it is needless to say that the present invention is not limited to the foregoing embodiments and various modifications and alterations can be made within the scope of the present invention.

What is claimed is:

1. A method of manufacturing a semiconductor device comprising the steps of:
   (a) preparing a lead frame having an outer frame extending in a first direction, a tab suspension lead support portion which extends in a second direction perpendicular to the first direction and which is connected to the outer frame, a first tab suspension lead and a second tab suspension lead which extend from the tab suspension lead support portion in an opposite direction in the first direction, a first tab connected to the first tab suspension lead, a second tab connected to the second tab suspension lead, a plurality of first leads arranged in a periphery of the first tab, and a plurality of second leads arranged in a periphery of the second tab;
   (b) mounting a first semiconductor chip, which has a plurality of first bonding pads on its main surface, on the first tab, and mounting a second semiconductor chip, which has a plurality of second bonding pads on its main surface, on the second tab;
   (c) electrically connecting the plurality of first bonding pads to the plurality of first leads, and electrically connecting the plurality of second bonding pads to the plurality of second leads;
   (d) forming a first sealing body which covers the first semiconductor chip, the first tab, and the first tab suspension lead, and forming a second sealing body which covers the second semiconductor chip, the second tab, and the second tab suspension lead; and
   (e) separating the first tab suspension lead and the second tab suspension lead from the tab suspension lead support portion by pressing the tab suspension lead support portion positioned between the first sealing body and the second sealing body by using a jig,
   wherein the first sealing body has a substantially rectangular outer shape when seen in a plan view, and has a first side extending in the second direction,
   the second sealing body has a substantially rectangular outer shape when seen in a plan view, and has a second side extending in the second direction,
   the first tab suspension lead has a first narrow portion, and the first side of the first sealing body intersects the first narrow portion, and
   the second tab suspension lead has a second narrow portion, and the second side of the second sealing body intersects the second narrow portion.

2. The method of manufacturing the semiconductor device according to claim 1, wherein a width of the jig in the first direction is narrower than a gap between the first sealing body and the second sealing body.

3. The method of manufacturing the semiconductor device according to claim 2,
wherein the gap between the first sealing body and the second sealing body is narrower than two times the width of the jig in the first direction.

4. The method of manufacturing the semiconductor device according to claim 1,
wherein a width of the first narrow portion is narrower than a width of the first tab suspension lead in the second direction at a position closer to the first tab than the first narrow portion.

5. The method of manufacturing the semiconductor device according to claim 1,
wherein the first tab suspension lead has a third side and a fourth side extending in the first direction, and a first notch is formed at the third side in the first narrow portion.

6. The method of manufacturing the semiconductor device according to claim 5,
wherein a second notch is further formed at the fourth side in the first narrow portion.

7. The method of manufacturing the semiconductor device according to claim 1,
wherein the step (d) includes the steps of:
(d-1) preparing a mold which has a plunger, a first cavity communicating with the plunger, and a second cavity communicating with the plunger via the first cavity;
(d-2) arranging the first semiconductor chip in the first cavity, and the second semiconductor chip in the second cavity; and
(d-3) injecting a sealing resin into the plunger so as to sequentially fill the first cavity and the second cavity with the sealing resin.

8. The method of manufacturing the semiconductor device according to claim 1,
wherein the first tab suspension lead has a flat side surface in a thickness direction.

9. A method of manufacturing a semiconductor device comprising the steps of:
(a) preparing a lead frame having an outer frame extending in a first direction, a tab suspension lead support portion which extends in a second direction perpendicular to the first direction and which is connected to the outer frame, a first tab suspension lead and a second tab suspension lead which extend from the tab suspension lead support portion in an opposite direction in the first direction, a first tab connected to the first tab suspension lead, a second tab connected to the second tab suspension lead, a plurality of first leads arranged in a periphery of the first tab, and a plurality of second leads arranged in a periphery of the second tab;
(b) mounting a first semiconductor chip, which has a plurality of first bonding pads on its main surface, on the first tab, and mounting a second semiconductor chip, which has a plurality of second bonding pads on its main surface, on the second tab;
(c) electrically connecting the plurality of first bonding pads to the plurality of first leads, and electrically connecting the plurality of second bonding pads to the plurality of second leads;

(d) forming a first sealing body which covers the first semiconductor chip, the first tab, and the first tab suspension lead, and forming a second sealing body which covers the second semiconductor chip, the second tab, and the second tab suspension lead; and
(e) separating the first tab suspension lead and the second tab suspension lead from the tab suspension lead support portion by pressing the tab suspension lead support portion positioned between the first sealing body and the second sealing body by using a jig,
wherein the first sealing body has a substantially rectangular outer shape when seen in a plan view, and has a first side extending in the second direction,
the second sealing body has a substantially rectangular outer shape when seen in a plan view, and has a second side extending in the second direction,
the first tab suspension lead has a first thin portion, and the first side of the first sealing body intersects the first thin portion, and
the second tab suspension lead has a second thin portion, and the second side of the second sealing body intersects the second thin portion.

10. The method of manufacturing the semiconductor device according to claim 9,
wherein a thickness of the first thin portion is smaller than a thickness of the first tab suspension lead at a position closer to the first tab than the first thin portion.

11. The method of manufacturing the semiconductor device according to claim 10,
wherein a cross-sectional surface of the first tab suspension lead in the first direction has a V-shaped groove in the first thin portion.

12. The method of manufacturing the semiconductor device according to claim 10,
wherein a cross-sectional surface of the first tab suspension lead in the first direction has a semicircular groove in the first thin portion.

13. The method of manufacturing the semiconductor device according to claim 9,
wherein the first tab suspension lead has a third side and a fourth side extending in the first direction when seen in a plan view, and a first notch is formed at the third side in the first thin portion.

14. The method of manufacturing the semiconductor device according to claim 13,
wherein a second notch is formed at the fourth side in the first thin portion.

15. The method of manufacturing the semiconductor device according to claim 9,
wherein the step (d) includes the steps of:
(d-1) preparing a mold which has a plunger, a first cavity communicating with the plunger, and a second cavity communicating with the plunger via the first cavity;
(d-2) arranging the first semiconductor chip in the first cavity, and the second semiconductor chip in the second cavity; and
(d-3) injecting a sealing resin into the plunger so as to sequentially fill the first cavity and the second cavity with the sealing resin.

* * * * *